(12) United States Patent
Liang

(10) Patent No.: US 10,501,278 B2
(45) Date of Patent: Dec. 10, 2019

(54) ATTACHING DEVICE FOR CONDUCTIVE ADHESIVE TAPE AND A MANUFACTURING METHOD OF DISPLAY PANEL

(71) Applicant: BOE TECHNOLOGY GROUP CO., LTD., Beijing (CN)

(72) Inventor: Pengxia Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 22 days.

(21) Appl. No.: 15/697,796

(22) Filed: Sep. 7, 2017

(65) Prior Publication Data
US 2018/0072531 A1   Mar. 15, 2018

(30) Foreign Application Priority Data

Sep. 9, 2016 (CN) .......................... 2016 1 0815002

(51) Int. Cl.
*B65H 35/00* (2006.01)
*B65H 37/00* (2006.01)
(Continued)

(52) U.S. Cl.
CPC ....... *B65H 35/0033* (2013.01); *B65H 37/002* (2013.01); *B65H 37/02* (2013.01);
(Continued)

(58) Field of Classification Search
CPC .......... B32B 38/0004; B32B 2038/045; B29C 2793/054; B26D 3/085; Y10T 156/1348; Y10T 156/1788
(Continued)

(56) References Cited

U.S. PATENT DOCUMENTS

| | | | | |
|---|---|---|---|---|
| 4,799,981 A | * | 1/1989 | Stone | G05B 19/353 156/361 |
| 2005/0076834 A1 | * | 4/2005 | Grande | B29C 70/384 118/600 |
| 2014/0008326 A1 | * | 1/2014 | Toyoda | H05H 1/46 216/69 |

FOREIGN PATENT DOCUMENTS

| CN | 101277588 A | 10/2008 |
|---|---|---|
| CN | 101840081 A | 9/2010 |

(Continued)

OTHER PUBLICATIONS

Chinese office action dated Oct. 31, 2018 for corresponding application No. 201610815002.5.

*Primary Examiner* — Linda L Gray
(74) *Attorney, Agent, or Firm* — Nath, Goldberg & Meyer; Joshua B. Goldberg

(57) ABSTRACT

The disclosure provides an attaching device for conductive adhesive tape and a manufacturing method of display panel. The attaching device disclosed herein comprises an adhesive tape attaching unit and a frame. An upper portion of the frame is provided with a first guide rail and a pair of second guide rails in parallel. The first guide rail is arranged to be perpendicular to the pair of second guide rails and movably connected between the pair of second guide rails. The adhesive tape attaching unit is movably mounted on the first guide rail. The attaching device for conductive adhesive tape and the manufacturing method of display panel according to the disclosure can attach the adhesive tape to a motherboard. The motherboard with the adhesive tape attached to can be cut to form a plurality of display panels. Therefore, it is possible to improve attaching efficiency and reduce cost of manufacturing.

17 Claims, 2 Drawing Sheets

(51) Int. Cl.
      *C09J 9/00*         (2006.01)
      *B65H 37/02*      (2006.01)
      *B65H 37/04*      (2006.01)
      *C09J 9/02*         (2006.01)
      *H01L 21/67*       (2006.01)
      *H01L 27/146*      (2006.01)
      *B32B 38/00*       (2006.01)

(52) U.S. Cl.
      CPC ................ *B65H 37/04* (2013.01); *C09J 9/02* (2013.01); *H01L 21/67132* (2013.01); *H01L 27/14601* (2013.01); *B32B 38/0004* (2013.01); *Y10T 156/1348* (2015.01); *Y10T 156/1788* (2015.01)

(58) Field of Classification Search
      USPC ........................................................ 156/527
      See application file for complete search history.

(56) References Cited

FOREIGN PATENT DOCUMENTS

| | | |
|---|---|---|
| CN | 101970363 A | 2/2011 |
| CN | 204287644 U | 4/2015 |
| KR | 20140028773 A | 3/2014 |
| WO | 2015122338 A1 | 8/2015 |

\* cited by examiner

ATTACHING DEVICE FOR CONDUCTIVE ADHESIVE TAPE AND A MANUFACTURING METHOD OF DISPLAY PANEL

CROSS-REFERENCE TO RELATED APPLICATION

This application claims the priority of Chinese Patent Application No. 201610815002.5 filed on Sep. 9, 2016, titled "AN ATTACHING DEVICE FOR CONDUCTIVE ADHESIVE TAPE AND A MANUFACTURING METHOD OF DISPLAY PANEL" in the Chinese Intellectual Property Office, the entire content of which is incorporated herein by reference.

FIELD OF THE TECHNOLOGY

The disclosure relates to the field of the display technologies, and particularly to an attaching device for conductive adhesive tape and a manufacturing method of a display panel.

BACKGROUND

At present, a variety of portable electronic devices almost employ a liquid crystal display panel as a display. Especially for some products such as video camera and player, notebook computer, mobile terminal or personal digital assistant, a liquid crystal display has become an essential module. Except for a liquid crystal panel, a driver chip is necessarily connected to a periphery of the liquid crystal display to control display signals. In order to complete conduction of the chip, it is necessary to attach a layer of Anisotropic Conductive Film (ACF) to a Flexible Printed Circuit (FPC).

When the ACF is attached to the FPC, currently a pressurization head can be used to attach an adhesive tape. Particularly, an ACF adhesive tape is pressed against a display substrate by the pressurization head for approximately 0.5-1 s. Then the pressurization head is taken off. In the end, an ACF liner tape attached to the display substrate is peeled off by a peeling bar and only a conductive adhesive film of the ACF remains.

When the ACF is attached to the FPC, currently a roller can be used to attach the adhesive tape. Particularly, the ACF is pressed against the display substrate in a direction by controlling the roller through a cylinder. Then the roller is taken off by the cylinder. In the end, the ACF liner tape is removed from the conductive adhesive film in the same direction by controlling a peeling bar through another cylinder.

The present inventor has found that at least following problems exist in above mentioned methods of attaching the adhesive tape. The adhesive tape attaching unit of the ACF attaching device in the prior art can operate only in a certain direction. In addition, no matter the attaching method using the pressurization head or the attaching method using the roller, ACF can simply attached to an individual display panel. That is to say, it is necessary to cut a motherboard of display panel and then attach the adhesive tape to each of display panels by the ACF attaching device. Therefore, once defects (for example, inaccurate registration) occur in the process of cutting, the subsequent attaching process may be infected to decrease a yield of the display panel.

SUMMARY OF THE INVENTION

Objectives of the disclosure are to provide an attaching device for conductive adhesive tape and a manufacturing method of a display panel which can effectively improve the attachment efficiency while reducing the cost of manufacturing.

In order to address above technical problems, the disclosure provides an attaching device for conductive adhesive tape, comprising an adhesive tape attaching unit and a frame. An upper portion of the frame is provided with a first guide rail and a pair of second guide rails in parallel, the first guide rail is arranged to be substantially perpendicular to the pair of second guide rails and movably connected between the pair of second guide rails, and the adhesive tape attaching unit is movably mounted on the first guide rail.

Preferably, sliding blocks are provided at both ends of the first guide rail, respectively, and the sliding blocks are configured to move along the pair of the second guide rails. More preferably, the sliding blocks can be silidably mounted within slots formed in the second guide rails, or slots formed in the sliding blocks can silidably match with flanges on the second guide rails.

Preferably, the adhesive tape attaching unit is driven to move along the first guide rail by a first drive unit, and the sliding blocks are driven to move long the pair of second guide rails in parallel by a second drive unit, such that the first guide rail and the adhesive tape attaching unit are moved together with the sliding blocks.

More preferably, the first drive unit and the second drive unit are an air cylinder or a hydraulic cylinder.

Preferably, the frame of the attaching device for conductive adhesive tape further comprises a bearing platform that is positioned under the frame to support a to-be-attached object.

Preferably, the adhesive tape attaching unit comprises: an adhesive tape supply module, configured to supply the conductive adhesive tape including a conductive adhesive film and a liner tape attached to the conductive adhesive film; a shearing module, configured to shear the conductive adhesive film on the conductive adhesive tape supplied from the adhesive tape supply module in accordance with a size of an attachment area of a to-be-attached object; a pressurization module, configured to press a sheared conductive adhesive film onto the attachment area of the to-be-attached object; and a liner tape recycling module, configured to recycle the liner tape of the conductive adhesive tape peeled off the conductive adhesive film after the conductive adhesive film is pressed onto the attachment area of the to-be-attached object.

Preferably, the adhesive tape supply module comprises an adhesive tape supply reel and a first motor, the conductive adhesive tape is wound around the adhesive tape supply reel and in the control of the first motor, the adhesive tape supply reel outputs the conductive adhesive tape.

More preferably, the pressurization module comprises: a third drive unit that is movably connected to the first guide rail at one end; and a pressurization head that is connected to the other end of the third drive unit.

More preferably, the third drive unit is a hydraulic rod, and the hydraulic rod comprises a liquid supply conduit, a conduit joint thread, a hydraulic transmission shaft and a hydraulic rod shell.

More preferably, the pressurization head is a roller-type pressurization head.

More preferably, the shearing module comprises: a fourth drive unit that is movably connected to the first guide rail at one end; and a shear that is connected to the other end of the fourth drive unit.

More preferably, the adhesive tape attaching unit further comprises a beam, a first stop block and a second stop block;

the first stop block and the second stop block have the same structure and each comprise a stop block body and a through-hole; the adhesive tape supply module and the liner tape recycling module are connected to opposing ends of the beam, respectively; the beam passes through the through-holes of the first stop block and the second stop block, such that the first stop block and the second stop block are movable along the beam; the third drive unit is connected to the first stop block; the fourth drive unit is connected to the second stop block; and the first stop block and the second stop block are able to locate the shearing module and the pressurization module.

In order to address above technical problems, the disclosure also provides a manufacturing method of display panel, comprising steps of: attaching a conductive adhesive tape onto each of display panels on a display motherboard by using the attaching device for conductive adhesive tape as set forth above; and cutting the display motherboard with the conductive adhesive tape attached along cutting lines to form individual display panels.

Preferably, the step of attaching a conductive adhesive tape onto each of display panels on a display motherboard further comprises:

Step a), moving the adhesive tape attaching unit to an initial position by the first drive unit and the second drive unit;

Step b), pressing the pressurization head onto the to-be-attached object under an urge of the third drive unit;

Step c), moving the adhesive tape attaching unit along the first guide rail by the first drive unit, while the pressurization head is attaching the conductive adhesive tape against an attachment area of the to-be-attached object in a movement direction of the adhesive tape attaching unit;

Step d), after the conductive adhesive tape is attached to a first line of the attachment area, raising the pressurization head by the third drive unit;

Step e), moving the first guide rail along the second guide rails by the second drive unit so as to move the adhesive tape attaching unit to a next line of the attachment area; and Step f), repeating the steps b)-e), until the attachment of the conductive adhesive tape on a whole attachment area is completed.

The embodiments of the disclosure provide following advantageous effects.

The attaching device for conductive adhesive tape and the manufacturing method of display panel according to the disclosure can attach the adhesive tape to a motherboard of display panel. After the adhesive tape is attached to the motherboard of display panel, the motherboard of display panel can be cut to form a plurality of display panels. Therefore, it is possible to improve attaching efficiency and reduce cost of manufacturing.

Figure 1:
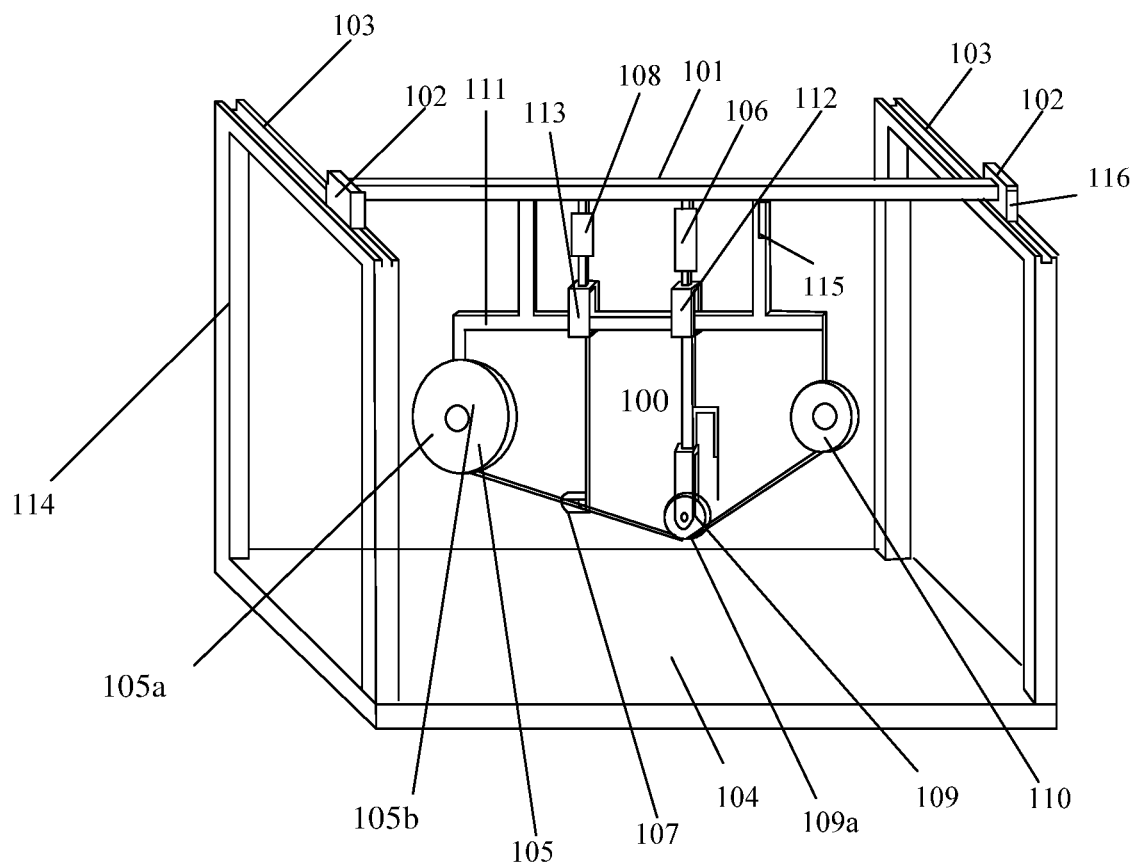
FIG. 1 is a schematic diagram showing a structure of an attaching device for conductive adhesive tape according to an embodiment of the disclosure.

Listing of reference numerals: 100: adhesive tape attaching unit; 101: first guide rail; 102: sliding block; 103: second guide rail; 104: bearing platform; 105: adhesive tape supply module; 106: third drive unit; 107: shearing module; 108: fourth drive unit; 109: pressurization module; 110: liner tape recycling module; 111: beam; 112: first stop block; 113: second stop block; 114: frame; 115: first drive unit; 116: second drive unit; 1061: liquid supply conduit; 1062: conduit joint thread; 1063: hydraulic transmission shaft; 1064: hydraulic rod shell; 1121: stop block body; 1122: stop block through-hole; 200: display motherboard; and 201: display panel.

DETAILED DESCRIPTION OF THE EMBODIMENTS

In order to better understand technical schemes of the disclosure by those skilled in related art, the disclosure will be further described in detail in conjunction with the accompanying drawings and specific embodiments.

The term "to-be-attached object" used herein refers to an object to which the conductive adhesive tape is to be attached. The term "to-be-attached area" or "attachment area" used herein refers to an area where the conductive adhesive tape is to be attached or is attached.

As shown in FIG. 1, there is provided an attaching device for conductive adhesive tape according to an embodiment. The attaching device for conductive adhesive tape is especially suitable for attaching (applying) anisotropic conductive adhesive tape. The attaching device for conductive adhesive tape comprises: an adhesive tape attaching unit 100 and a frame 114, wherein an upper portion of the frame 114 is provided with a first guide rail 101 and a pair of second guide rails 103 in parallel, the first guide rail 101 is arranged to be substantially perpendicular to the pair of second guide rails 103 and movably connected between the pair of second guide rails 103, and the adhesive tape attaching unit 100 is movably mounted on the first guide rail 101.

From a top view of the attaching device for conductive adhesive tape in this embodiment, the first guide rail 101 and the pair of second guide rails 103 can be formed in an "H" shape. The first guide rail 101 can be moved along the pair of second guide rails 103. In the meanwhile, the adhesive tape attaching unit 100 can be moved along the first guide rail 101. As such, by means of the first guide rail 101 and the second guide rails 103, the adhesive tape attaching unit 100 can be moved in two directions that are substantially perpendicular to each other. According to this embodiment of the disclosure, the attaching device for conductive adhesive tape can attach the adhesive tape to a motherboard of display panel. After the adhesive tape is attached to the motherboard of display panel, the motherboard of display panel can be cut to form a plurality of display panels. Therefore, it is possible to improve attaching efficiency and reduce cost of manufacturing.

Additionally, the attaching device for conductive adhesive tape in this embodiment may further comprise a control unit in which information on a to-be-attached object is stored in advance. For example, the to-be-attached object may be a whole motherboard of display panel. At this point, coordinates of a to-be-attached area on the motherboard of display panel can be obtained. The control unit is able to control the first guide rail 101 and the adhesive tape attaching unit 100 in accordance with the information to attach the conductive adhesive tape to the motherboard of display panel.

Figure 2:
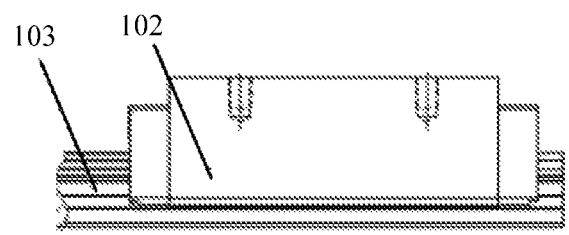
FIG. 2 is a schematic diagram showing a connection between a sliding block and a second guide rail of the attaching device for conductive adhesive tape according to the embodiment of the disclosure.

Preferably, in this embodiment, as shown in FIGS. 1 and 2, sliding blocks 102 are provided at both ends of the first guide rail 101, respectively, and the sliding blocks 102 are configured to move along the pair of the second guide rails 103. As an example, the sliding blocks 102 can be silidably mounted within slots formed in the second guide rails, or slots formed in the sliding blocks can silidably match with flanges on the second guide rails. In particular, the adhesive tape attaching unit 100 can be drive to move along the first guide rail 101 by a first drive unit 115, and the sliding blocks 102 can be driven to move along the pair of second guide rails 103 in parallel by a second drive unit 116 such that the first guide rail 101 and the adhesive tape attaching unit 100 can be moved together with the sliding blocks 102.

In this embodiment of the disclosure, the first drive unit and the second drive unit can be drive unit or driver commonly known in the prior art. For example, the first drive unit and the second drive unit can be an air cylinder or a hydraulic cylinder.

Preferably, in this embodiment, the frame 114 of the attaching device for conductive adhesive tape further comprises a bearing platform 104 that is positioned under the frame 114 to support a to-be-attached object.

Preferably, the adhesive tape attaching unit 100 can particularly comprise: an adhesive tape supply module 105, configured to supply the conductive adhesive tape including a conductive adhesive film and a liner tape attached to the conductive adhesive film; a shearing module 107, configured to shear the conductive adhesive film on the conductive adhesive tape supplied from the adhesive tape supply module 105 in accordance with a size of an attachment area of the to-be-attached object; a pressurization module 109, configured to press a sheared conductive adhesive film onto the attachment area of the to-be-attached object; and a liner tape recycling module 110, configured to recycle the liner tape of the conductive adhesive tape peeled off the conductive adhesive film after the conductive adhesive film is pressed onto the attachment area of the to-be-attached object.

In particular, the adhesive tape supply module 105 can comprise an adhesive tape supply reel 105a and a first motor 105b. The conductive adhesive tape is wound around the adhesive tape supply reel 105a. In the control of the first motor 105b, the adhesive tape supply reel 105a outputs the conductive adhesive tape.

The pressurization module 109 can comprise: a third drive unit 106 that is movably connected to the first guide rail 101 at one end; and a pressurization head that is connected to the other end of the third drive unit 106.

In the attachment of the conductive adhesive tape to a to-be-attached object, a) the first drive unit and the second drive unit move the adhesive tape attaching unit 100 to an initial position (for example, a corner of a to-be-attached area); b) under an urge of the third drive unit 106, the pressurization head exerts pressure on the to-be-attached object; c) the first drive unit moves the adhesive tape attaching unit 100 along the first guide rail 101, while the pressurization head attaches the adhesive tape against the to-be-attached area of the object in a movement direction of the adhesive tape attaching unit 100; d) after the adhesive tape is attached to a first line of the to-be-attached area, the third drive unit 106 raises the pressurization head; e) the second drive unit moves the first guide rail 101 along the second guide rails 103 so as to move the adhesive tape attaching unit 100 to a next line of the to-be-attached area; then above-described steps b) to e) are repeated until the attachment of the adhesive on a whole attachment area is completed.

Figure 3:
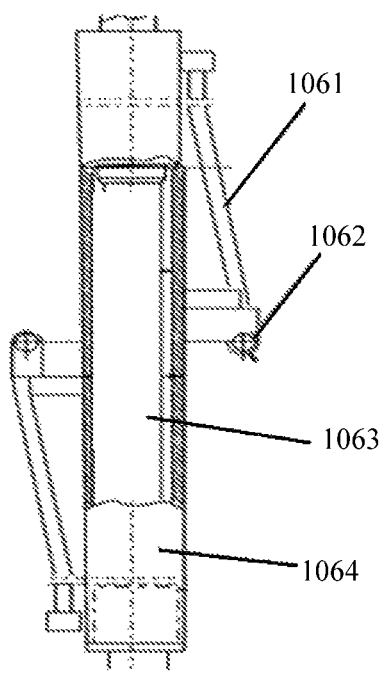
FIG. 3 is a schematic diagram showing a stop block of the attaching device for conductive adhesive tape according to the embodiment of the disclosure.

In this embodiment, the third drive unit preferably is a hydraulic rod. As shown in FIG. 3, the hydraulic rod typically comprises a liquid supply conduit 1061, a conduit joint thread 1062, a hydraulic transmission shaft 1063 and a hydraulic rod shell 1064. In this embodiment, the pressurization head preferably is roller-type pressurization head 109a. By rolling the roller-type pressurization head 109a on a side of the liner tape of the conductive adhesive tape, the conductive adhesive film of the conductive adhesive tape can be pressed onto the attachment area of the to-be-attached object. Of course, at the same time of the rolling of the pressurization head, the bearing platform 104 can heat the conductive adhesive tape to firmly attach the conductive adhesive film to the attachment area. The roller-type pressurization head 109a can be suitable for panels having various sizes. Therefore, the roller-type pressurization head 109a has more excellent universality and convenience.

Figure 4:
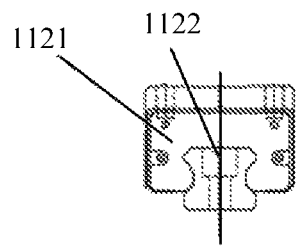
FIG. 4 is a schematic diagram showing a hydraulic rod of the attaching device for conductive adhesive tape according to the embodiment of the disclosure.

The shearing module 107 comprises: a fourth drive unit 108 that is movably connected to the first guide rail 101 at one end; and a shear that is connected to the other end of the fourth drive unit 108. In the shearing of the conductive adhesive tape, the shear is moved to a position of the conductive adhesive tape under an urge of the fourth drive unit 108 and then cuts the conductive adhesive tape in accordance with a size of the to-be-attached object. In this embodiment, the fourth drive unit 108 can be a drive unit or a driver commonly know in the prior art. For example, the fourth drive unit 108 can be an air cylinder or a hydraulic cylinder. Further, the adhesive tape attaching unit 100 may comprise a beam 111, a first stop block 112, a second stop block 113, wherein, as shown in FIG. 4, the first stop block 112 and the second stop block 113 have the same structure and each comprise a stop block body 1121 and a through-hole 1122. The adhesive tape supply module 105 and the liner tape recycling module 110 are connected to opposing ends of the beam 111, respectively. The beam 111 passes through the through-holes 1122 of the first stop block 112 and the second stop block 113, such that the first stop block 112 and the second stop block 113 are movable along the beam 111. The third drive unit 106 (for example, the hydraulic rod) is connected to the first stop block 112. The fourth drive unit 108 (for example, the air cylinder) is connected to the second stop block 113. The first stop block 112 and the second stop block 113 can accurately locate the shearing module 107 and the pressurization module 109.

It should be explained that, in the shearing of the conductive adhesive tape, a distance between the first stop block 112 and the second stop block 113 can be controlled and adjusted in accordance with the size of the to-be-attached object, such that a distance between the shearing module 107 and the pressurization module 109 corresponds to the size of the to-be-attached area. Then, the conductive adhesive film on the conductive adhesive tape supplied from the adhesive tape supply module 105 can be cut.

The liner tape recycling module 110 could be a recycling reel. After the conductive adhesive tape is completely attached, the pressurization module 109 can be raised to the initial position, and then the recycling reel is rotated to recycle the liner tape of the conductive adhesive tape peeled off the conductive adhesive film.

Further, the adhesive tape attaching unit may include an alignment camera which is connected to the pressurization module and configured to align the pressurization module with the attachment area on the to-be-attached object.

In order to more clearly understand the attaching device for conductive adhesive tape in this embodiment, operation steps of the attaching device for conductive adhesive tape will be described hereinafter.

Step 1, laying the display motherboard on the bearing platform 104, and then adsorbing the display motherboard on the bearing platform 104 for example by a vacuum supply;

Step 2, capturing an alignment mark on the display panel to be attached in the display motherboard by the camera of the attaching device, such that the pressurization head in the pressurization module 109 aligns with the alignment mark on the display panel;

Step 3, cutting the conductive adhesive tape by the shearing module 107 in accordance with the information on the to-be-attached object stored in the control unit in advance, wherein only the conductive adhesive film, rather than the liner tape, of the conductive adhesive tape is cut at this point;

Step 4, by means of the fourth drive unit 108 (for example, the hydraulic rod) of the pressurization module 109, the pressurization head pressing the conductive adhesive tape onto the to-be-attached object, wherein the bearing platform 104 can heat the attached conductive adhesive tape and after that, the fourth drive unit 108 can raise the pressurization head again so that the attachment of the conductive adhesive tape is completed;

Step 5, recycling the liner tape by the liner tape recycling module 110; and Step 6, completing the attachment of the conductive adhesive tape on the whole motherboard of display panel following above steps.

Figure 5:
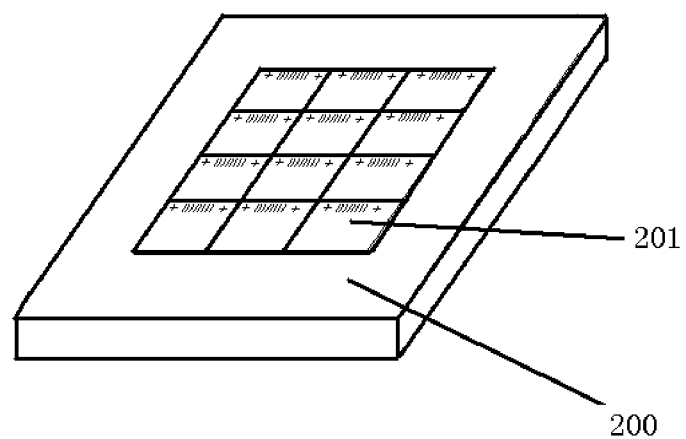
FIG. 5 is a schematic diagram showing a display motherboard and display panels according to the embodiment of the disclosure.

Accordingly, as shown in FIG. 5, there is provided a manufacturing method of a display panel in this embodiment. The method comprises steps of: attaching a conductive adhesive tape onto a to-be-attached area of each of display panels 201 arranged in array on a motherboard 200 by the attaching device for conductive adhesive tape as set forth above; and cutting the motherboard 200 with the attached conductive adhesive tape along cutting lines to form individual display panels.

In particular, the step of attaching a conductive adhesive tape onto a to-be-attached area of each of display panels 201 arranged in array on a motherboard 200 further comprises:

Step a), moving the adhesive tape attaching unit 100 to an initial position (for example, a corner of the to-be-attached area) by the first drive unit and the second drive unit;

Step b), pressing the pressurization head onto a to-be-attached object under an urge of the third drive unit 106;

Step c), moving the adhesive tape attaching unit 100 along the first guide rail 101 by the first drive unit, while the pressurization head is attaching the conductive adhesive tape against an attachment area of the to-be-attached object in a movement direction of the adhesive tape attaching unit 100;

Step d), after the conductive adhesive tape is attached to a first line of the attachment area, raising the pressurization head by the third drive unit 106;

Step e), moving the first guide rail 101 along the second guide rails 103 by the second drive unit so as to move the adhesive tape attaching unit 100 to a next line of the attachment area; and Step f), repeating above steps b)-e), until the attachment of the conductive adhesive tape on a whole attachment area is completed.

According to the manufacturing method of the display panel in the disclosure, the adhesive tapes can be attached to the motherboard of display panel. After the attachment of the adhesive tapes to the motherboard of display panel, the motherboard of display panel can be cut to form a plurality of display panels. Therefore, it is possible to effectively improve the attachment efficiency while reducing the cost of manufacturing.

It should be understood that the above implementations are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

The invention claimed is:

1. An attaching device for conductive adhesive tape, comprising an adhesive tape attaching unit and a frame, wherein
    an upper portion of the frame is provided with a first guide rail and a pair of second guide rails in parallel,
    the first guide rail is arranged to be substantially perpendicular to the pair of second guide rails and movably connected between the pair of second guide rails, and
    the adhesive tape attaching unit is movably mounted on the first guide rail and comprises an adhesive tape supply module, configured to supply the conductive adhesive tape including a conductive adhesive film and a liner tape attached to the conductive adhesive film;
    the adhesive tape attaching unit comprises a shearing module, configured to shear the conductive adhesive film on the conductive adhesive tape supplied from the adhesive tape supply module in accordance with a size of an attachment area of a to-be-attached object, and including a fourth drive unit having two ends and a shear, wherein one end of the fourth drive unit is movably connected to the first guide rail and the other end of the fourth drive unit is connected to the shear.

2. The attaching device for conductive adhesive tape according to claim 1, wherein
    sliding blocks are provided at both ends of the first guide rail, respectively, and
    the sliding blocks are configured to move along the pair of the second guide rails.

3. The attaching device for conductive adhesive tape according to claim 2, wherein the adhesive tape attaching unit is driven to move along the first guide rail by a first drive unit, and the sliding blocks are driven to move long the pair of second guide rails in parallel by a second drive unit, such that the first guide rail and the adhesive tape attaching unit are moved together with the sliding blocks.

4. The attaching device for conductive adhesive tape according to claim 3, wherein
    the first drive unit and the second drive unit are an air cylinder or a hydraulic cylinder.

5. The attaching device for conductive adhesive tape according to claim 1, wherein
    the frame of the attaching device for conductive adhesive tape further comprises a bearing platform that is positioned under the frame to support a to-be-attached object.

6. The attaching device for conductive adhesive tape according to claim 1, wherein the adhesive tape attaching unit comprises:
a pressurization module, configured to press a sheared conductive adhesive film onto the attachment area of the to-be-attached object; and
a liner tape recycling module, configured to recycle the liner tape of the conductive adhesive tape peeled off the conductive adhesive film after the conductive adhesive film is pressed onto the attachment area of the to-be-attached object.

7. The attaching device for conductive adhesive tape according to claim 6, wherein
the adhesive tape supply module comprises an adhesive tape supply reel and a first motor,
the conductive adhesive tape is wound around the adhesive tape supply reel, and
the first motor controls the adhesive tape supply reel to output the conductive adhesive tape.

8. The attaching device for conductive adhesive tape according to claim 6, wherein
the pressurization module comprises: a third drive unit having two ends and a pressurization head, wherein one end of the third drive unit is movably connected to the first guide rail and the other end of the third drive unit is connected to the pressurization head.

9. The attaching device for conductive adhesive tape according to claim 8, wherein the pressurization head is a roller-type pressurization head.

10. The attaching device for conductive adhesive tape according to claim 8, wherein
the third drive unit is a hydraulic rod, and
the hydraulic rod comprises a liquid supply conduit, a conduit joint thread, a hydraulic transmission shaft and a hydraulic rod shell.

11. The attaching device for conductive adhesive tape according to claim 8, wherein
the adhesive tape attaching unit further comprises a beam, a first stop block and a second stop block;
the first stop block and the second stop block have the same structure and each comprise a stop block body and a through-hole;
the adhesive tape supply module and the liner tape recycling module are connected to opposing ends of the beam, respectively;
the beam passes through the through-holes of the first stop block and the second stop block, such that the first stop block and the second stop block are movable along the beam;
the third drive unit is connected to the first stop block;
the fourth drive unit is connected to the second stop block; and
the first stop block and the second stop block are able to locate the shearing module and the pressurization module.

12. A manufacturing method of a display panel, comprising steps of:
attaching a conductive adhesive tape onto each of display panels on a display motherboard by using the attaching device for conductive adhesive tape according to claim 1; and
cutting the display motherboard with the conductive adhesive tape attached along cutting lines to form individual display panels.

13. The method according to claim 12, wherein
sliding blocks are provided at both ends of the first guide rail, respectively, and
the method further comprises: moving the sliding blocks along the pair of the second guide rails.

14. The method according to claim 13, wherein
the adhesive tape attaching unit is driven to move along the first guide rail by a first drive unit, and
the sliding blocks are driven to move long the pair of second guide rails in parallel by a second drive unit, such that the first guide rail and the adhesive tape attaching unit are moved together with the sliding blocks.

15. The method according to claim 14, wherein
the step of attaching a conductive adhesive tape onto each of display panels on a display motherboard by using the attaching device for conductive adhesive tape comprises:
supplying the conductive adhesive tape including a conductive adhesive film and a liner tape attached to the conductive adhesive film by the adhesive tape supply module;
shearing the conductive adhesive film on the conductive adhesive tape supplied from the adhesive tape supply module in accordance with a size of an attachment area of the to-be-attached object by a shearing module;
pressing a sheared conductive adhesive film onto the attachment area of the to-be-attached object by a pressurization module; and
recycling the liner tape of the conductive adhesive tape peeled off the conductive adhesive film after the conductive adhesive film is pressed onto the attachment area of the to-be-attached object by a liner tape recycling module.

16. The method according to claim 15, wherein
the pressurization module comprises: a third drive unit having two ends and a pressurization head, wherein one end of the third drive unit is movably connected to the first guide rail and the other end of the third drive unit is connected to the pressurization head.

17. The method according to claim 12, wherein the step of attaching a conductive adhesive tape onto each of display panels on a display motherboard further comprises:
Step a), moving the adhesive tape attaching unit to an initial position by a first drive unit and a second drive unit;
Step b), pressing a pressurization head onto the to-be-attached object under an urge of a third drive unit;
Step c), moving the adhesive tape attaching unit along the first guide rail by the first drive unit, while the pressurization head is attaching the conductive adhesive tape against an attachment area of the to-be-attached object in a movement direction of the adhesive tape attaching unit;
Step d), after the conductive adhesive tape is attached to a first line of the attachment area, raising the pressurization head by the third drive unit;
Step e), moving the first guide rail along the second guide rails by the second drive unit so as to move the adhesive tape attaching unit to a next line of the attachment area; and
Step f), repeating the steps b)-e), until the attachment of the conductive adhesive tape on a whole attachment area is completed.

* * * * *